United States Patent [19]
Lee et al.

[11] Patent Number: 6,051,998
[45] Date of Patent: Apr. 18, 2000

[54] OFFSET-COMPENSATED PEAK DETECTOR WITH OUTPUT BUFFERING

[75] Inventors: Jeffrey C. Lee, Burlington; Gregory T. Brauns, Raleigh, both of N.C.

[73] Assignee: Mitsubishi Semiconductor America, Inc., Durham, N.C.

[21] Appl. No.: 09/064,190

[22] Filed: Apr. 22, 1998

[51] Int. Cl.[7] .......................... G01R 19/00; H03K 5/153
[52] U.S. Cl. ................................ 327/59; 327/91; 327/307
[58] Field of Search ................... 327/58–62, 91, 327/94–96, 307, 362, 354

[56] References Cited

U.S. PATENT DOCUMENTS

| | | | |
|---|---|---|---|
| 3,699,357 | 10/1972 | Lloyd | 327/59 |
| 3,988,689 | 10/1976 | Ochi et al. | 330/9 |
| 4,363,977 | 12/1982 | Tsuda et al. | 307/358 |
| 4,393,351 | 7/1983 | Gregorian et al. | 328/127 |
| 4,404,525 | 9/1983 | Amir et al. | 330/9 |
| 4,460,873 | 7/1984 | Hester | 330/259 |
| 4,543,534 | 9/1985 | Temes et al. | 330/9 |
| 4,585,956 | 4/1986 | Lie | 327/95 |
| 4,595,959 | 6/1986 | Bailey | 327/91 |
| 4,866,301 | 9/1989 | Smith | 327/60 |
| 4,942,367 | 7/1990 | Milkovic | 330/9 |
| 4,996,448 | 2/1991 | Abdi | 327/59 |
| 5,028,815 | 7/1991 | Van De Plassche | 307/355 |
| 5,120,995 | 6/1992 | Abdi | 307/351 |
| 5,302,863 | 4/1994 | Walley et al. | 307/351 |
| 5,311,085 | 5/1994 | Pelgrom et al. | 307/494 |
| 5,397,940 | 3/1995 | Janssen | 326/83 |
| 5,399,964 | 3/1995 | Zoller | 324/103 P |
| 5,430,765 | 7/1995 | Nagahori | 375/318 |
| 5,479,130 | 12/1995 | McCartney | 327/341 |
| 5,506,526 | 4/1996 | Seesink | 327/91 |
| 5,617,054 | 4/1997 | Koifman et al. | 327/362 |
| 5,638,020 | 6/1997 | Koifman et al. | 327/382 |

*Primary Examiner*—Toan Tran
*Attorney, Agent, or Firm*—McDermott, Will & Emery

[57] ABSTRACT

A peak detector is provided with a comparator and a storage capacitor coupled to the output of the comparator. An analog input signal is supplied via an input capacitor to the inverting input of the comparator. The non-inverting input of the comparator receives an output signal produced by an output buffer arranged in a feedback loop of the comparator. A level shifter is coupled in the feedback loop to dynamically adjust an input signal supplied to the output buffer in accordance with application requirements. The operation of the peak detector is controlled by non-overlapping clock signals supplied to switches at the input and inner feedback loop of the comparator to cancel offset caused by the comparator and output buffer.

20 Claims, 3 Drawing Sheets

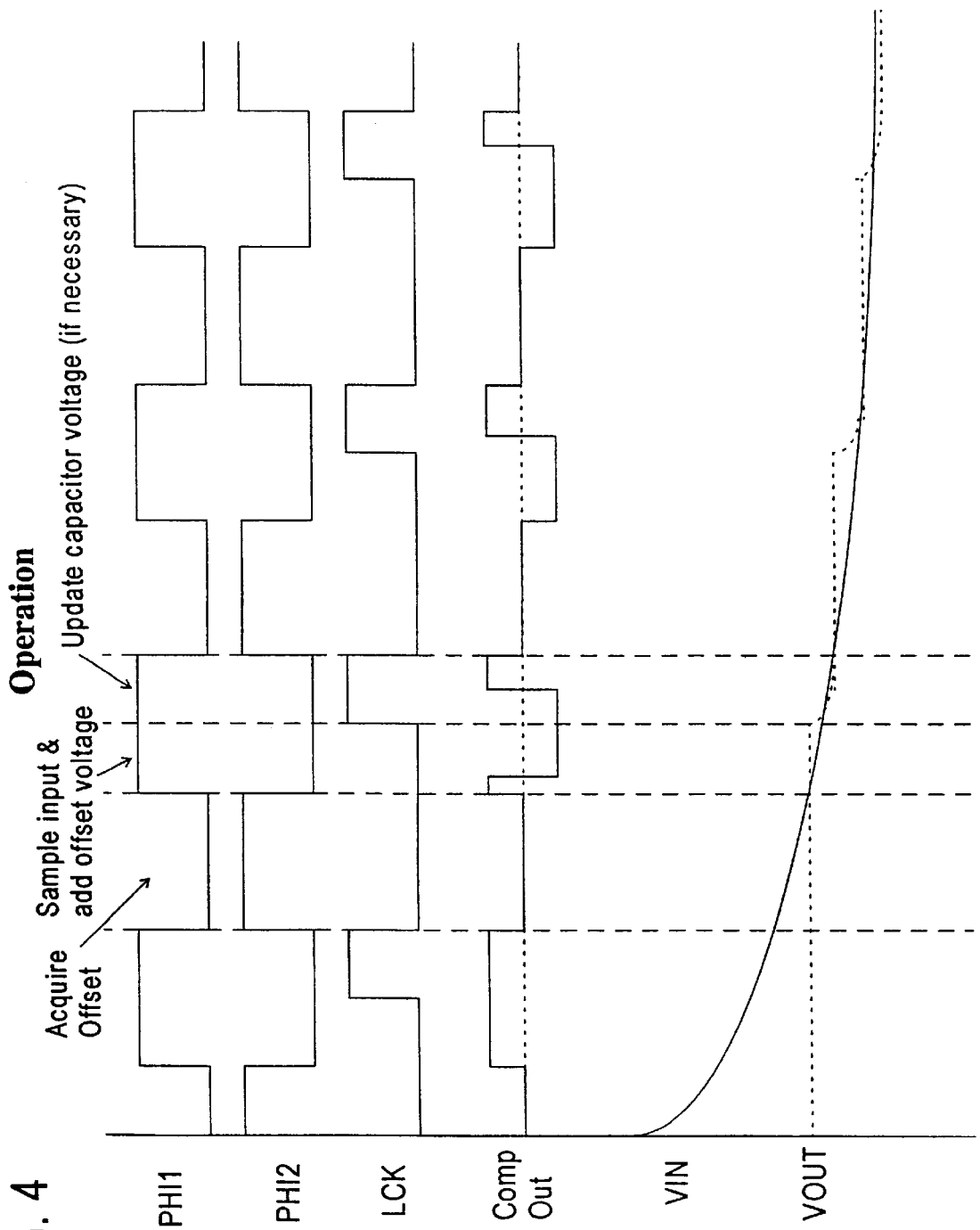

great, 051,998

OFFSET-COMPENSATED PEAK DETECTOR WITH OUTPUT BUFFERING

FIELD OF THE INVENTION

The present invention relates to circuits for detecting the peak value of an input signal, and more particularly, to a peak detector with offset compensation circuitry and an embedded output buffer.

BACKGROUND ART

Peak detectors are used for detecting and holding the maximum or minimum value of a input signal, such as a sinusoidal signal, a data pulse, etc. Referring to FIG. 1, a conventional peak detector 10 comprises an analog comparator 12 that compares an input signal with a voltage stored on a capacitor $C_{HOLD}$ coupled to an output of the peak detector 10.

In the case of a positive peak detector, the input signal is supplied to the non-inverting input of the comparator 12, whereas the capacitor voltage is supplied to the inverting input of the comparator 12. If the input signal exceeds the capacitor voltage, the output of the comparator 12 closes a switch 14 connected between the capacitor $C_{HOLD}$ and a voltage source Vs. The switch 14 may be a MOSFET or another active device controlled by the output of the comparator 12 applied to a control gate or electrode. The closed condition of the switch 14 corresponds to the active state of the active device.

When the switch 14 is closed, the charge on the capacitor $C_{HOLD}$ is increased until the capacitor voltage exceeds the input signal. When this occurs, the output of the comparator 12 changes, opening the switch 14 or shutting off the active device that represents the switch 14. As a result, the capacitor voltage is "locked" at a level corresponding to the peak value of the input signal. FIG. 2 is a timing diagram illustrating the output and input signals of the peak detector 10.

However, due to component mismatches, each comparator has its unique inherent offset voltage Voff. The offset voltage may be represented by a voltage source Vosc connected to the non-inverting terminal of the comparator 12. Voltage Vout at the output of the peak detector 10 will be in error by the voltage amount introduced by the voltage source Vosc:

Vout=Vin.(max)+Vosc.

Thus, the accuracy of the peak detector is affected by the offset voltage. As the magnitude of the offset voltage is unique for each peak detector due to unique component mismatches, the offset voltage effects are not predictable and therefore difficult to eliminate.

In peak detection applications where high accuracy is required, and the magnitude and polarity of the offset voltage are unknown, it would be desirable to provide offset compensation circuitry for removing the offset.

Further, a unity gain buffer, or other such circuitry, may be required to drive any output of a peak detector where a capacitor coupled to the output can be discharged. For example, a unity gain buffer 16 is required to drive the output of the peak detector 10 shown in FIG. 1 to prevent the discharge of the capacitor $C_{HOLD}$. Such an output buffer introduces additional offset represented by a voltage source Vos connected to an input of the buffer 16. As a result, the accuracy of the peak detector 10 would be further affected by offset effects caused by the output buffer 16.

Thus, to improve the accuracy of the peak detector, it would be desirable to provide an offset compensation arrangement that eliminates offset effects caused by the output buffer.

DISCLOSURE OF THE INVENTION

Accordingly, one advantage of the present invention is in providing a peak detector having offset compensation circuitry for eliminating offset effects.

Another advantage of the present invention is in providing an offset compensation arrangement in a peak detector with an output buffer to eliminate offset effects caused by the output buffer.

These and other advantages of the present invention are achieved, at least in part, by providing a system for detecting a peak value of a signal supplied via an input terminal. Via an input capacitor, the input terminal is connected to a first input of a comparator having an output coupled to a storage capacitor, which produces voltage corresponding to the peak value of the input signal. An output buffer is arranged in a feedback loop between the storage capacitor and a second input of the comparator, for buffering the capacitor voltage to produce an output signal supplied to the second input of the comparator.

In accordance with a preferred embodiment of the present invention, a first switch may be coupled between the input and the input capacitor and controlled by a first clock signal. A second switch may be coupled between the output of the output buffer and the second input of the comparator and controlled by a second clock signal. The first and second clock signals may be complementary, non-overlapping signals. A third switch may be arranged between the output of the comparator and the first input of the comparator and controlled by the first clock signal.

The second and third switches are closed to connect the output buffer to the input capacitor, and to connect the output and the first input of the comparator when the second clock signal is in an active state. At that time, the first switch is open to disconnect the input terminal from the input capacitor.

When the first clock signal is in an active state, the first switch is closed to supply the input signal via the input capacitor to the first input of said comparator when said first clock signal is in the active state. The second and third switches are open when the input signal is supplied to the first input of said comparator.

In accordance with one aspect of the invention, an inverter may be coupled between the output of the comparator and the storage capacitor for changing the polarity of an output signal of the comparator supplied to the storage capacitor.

Further, a fourth switch may be coupled between the output of the comparator and the inverter and controlled by a first control signal activated during an active period of the first clock signal. A fifth switch may be provided between the input of the inverter and a ground terminal and controlled by a second control signal inverted with respect to the first control signal.

A sixth switch may be coupled between the storage capacitor and a ground terminal and controlled by an output signal of the inverter. The sixth switch is opened to prevent the storage capacitor from being discharged when the input signal is higher than the output signal. This switch is closed to allow the storage capacitor to discharge when the input signal is lower than the output signal.

In accordance with another aspect of the invention, a seventh switch may be arranged between the storage capacitor and a voltage source and controlled by a refresh signal activated to charge the storage capacitor from the voltage source.

In accordance with another aspect of the invention, a level shifter may be provided between the storage capacitor and the output buffer for adjusting an input signal supplied to the output buffer.

In accordance with a method of the present invention, offset cancellation is provided in a system for detecting a peak value of an input signal and having a comparator, a storage capacitor coupled to an output of the comparator, and an output buffer coupled in a first feedback loop between the storage capacitor and a first input of the comparator, for producing an output signal representing the peak value.

The following steps are carried out to perform offset cancellation:

activating a first control signal to form a second feedback loop by connecting an output of the output buffer via an input capacitor to a second input of the comparator, activating a second control signal non-overlapping with the first control signal to disconnect the buffer from the second input and allow the input signal to be supplied via the input capacitor to the second input of the comparator, and connecting the output of the comparator to the storage capacitor to allow a charge on the storage capacitor to be modified in accordance with a value produced at the output of the comparator.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 4 is a timing diagram illustrating the operation of the offset-compensated peak detector.

BEST MODE FOR CARRYING OUT THE INVENTION

Figure 1:
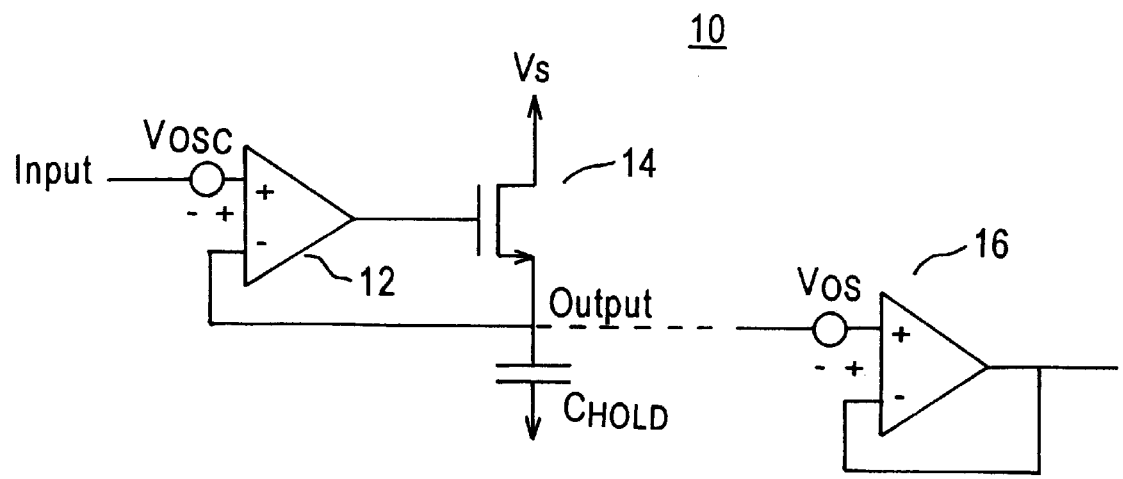
FIG. 1 is a schematic diagram showing a conventional peak detector.
Figure 2:
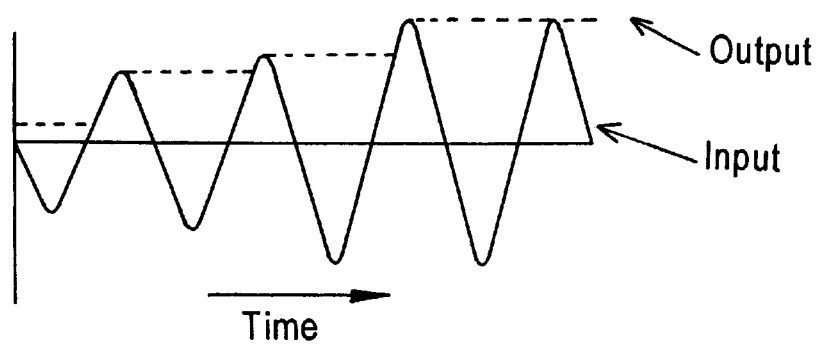
FIG. 2 is a timing diagram illustrating input and output signals in the conventional peak detector.
Figure 3:
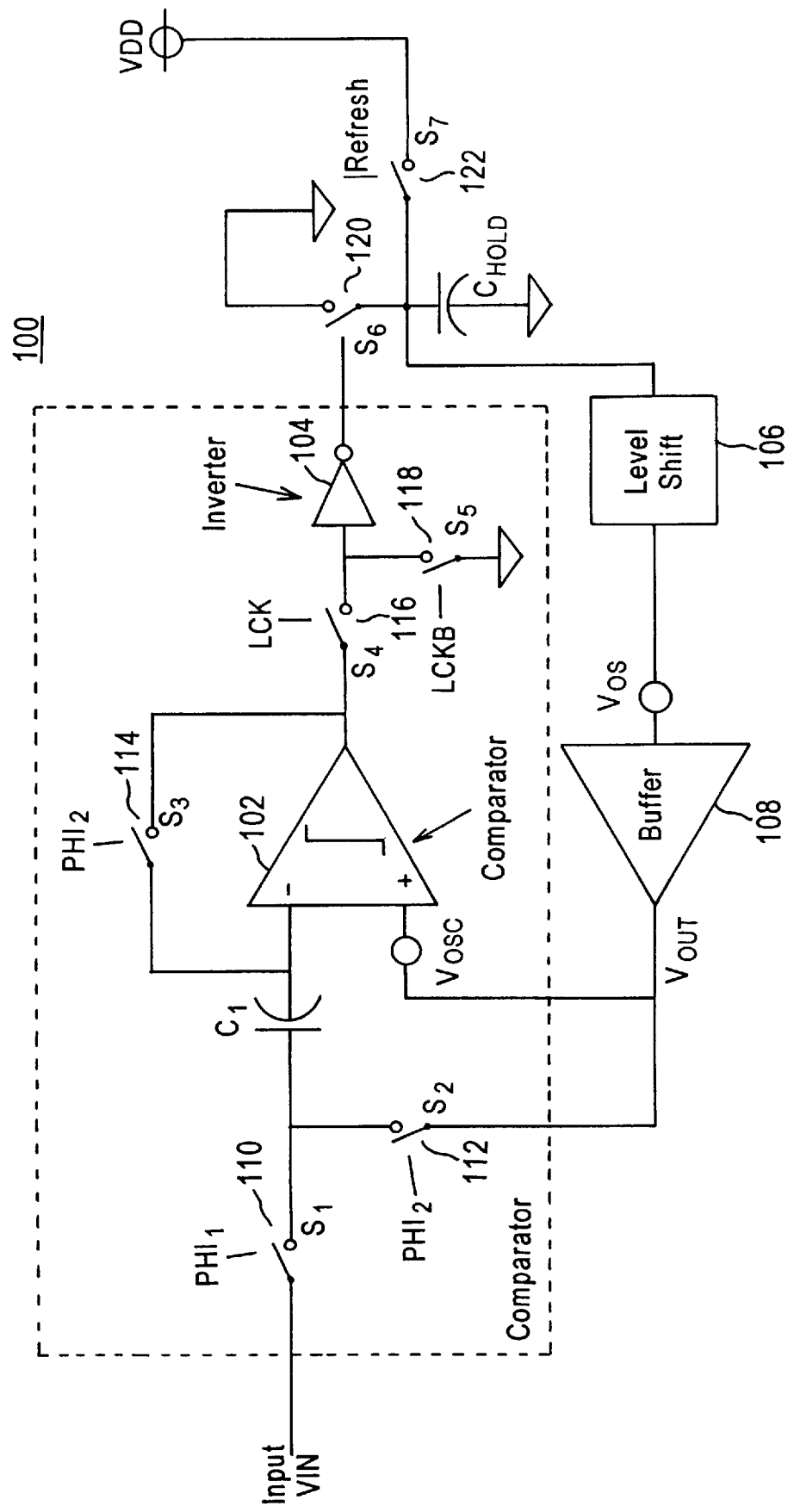
FIG. 3 is a simplified circuit diagram of an exemplary offset-compensated peak detector of the present invention.

Reference is now made to FIG. 3 of the drawings that shows a simplified circuit diagram of an exemplary offset-compensated peak detector with output buffering of the present invention. Although the present invention will be discussed with the example of a negative peak detector 100 arranged to detect the minimum value of an input signal, it will become apparent, however, that the present invention is applicable to any type of a peak detector.

The peak detector 100 comprises a comparator 102, a storage capacitor $C_{HOLD}$ coupled to the output of the comparator 102 via an inverter 104, a level shifter 106 coupled to the storage capacitor $C_{HOLD}$ for adjusting a dynamic range of an input signal supplied to an output buffer 108 connected to the output of the level shifter 106. As discussed in more detail later, the output buffer 108 is used to prevent the discharge of the storage capacitor $C_{HOLD}$ during an offset cancellation phase of peak detector operation.

An output voltage Vout that corresponds to the minimum value of the input signal is produced at the output of the buffer 108. A voltage source Vosc connected to the non-inverting input of the comparator 102 represents the offset voltage introduced by the comparator 102. A voltage source Vos connected to the input of the buffer 108 represents the offset voltage caused by the output buffer 108.

An input capacitor C1 is coupled between the input of the peak detector 100 and the inverting input of the comparator 102. The non-inverting input of the comparator 102 is coupled to the output of the buffer 108 to form a feedback loop that includes the level shifter 106 and the buffer 108.

A switch 110 is arranged between the input of the peak detector 100 and the input capacitor C1, a switch 112 is provided between the output of the buffer 108 and the input capacitor C1, and a switch 114 is coupled between the output and the inverting input of the comparator 102. Non-overlapping complementary clock signals PHI1 and PHI2 illustrated in FIG. 3 are used to control the switches 110, 112, and 114. The switch 110 is controlled by the clock signal PHI1, whereas the switches 112 and 114 are controlled by the clock signal PHI2. For example, each of the switches 110, 112 and 114 may be a MOSFET having its gate supplied with the corresponding clock signal.

The switch 110 is closed when the clock signal PHI1 is at a high level, and is open when the clock signal PHI1 is at a low level. Similarly, the switches 112 and 114 are closed when the clock signal PHI2 is at a high level, and are open when the clock signal PHI2 is at a low level.

A switch 116 is arranged between the output of the comparator 102 and the input of the inverter 104, and a switch 118 is coupled between the input of the inverter 104 and a ground terminal. The switch 116 is controlled by a clock signal LCK shown in FIG. 4, and the switch 118 is controlled by a signal LCKB inverted with respect to the signal LCK. When the clock signal LCK is at a high level, the switch 116 is closed, and the switch 118 is open. When the clock signal LCK goes low, the switch 116 opens and the switch 118 closes. MOSFET devices having their gates supplied with the signals LCK and LCKB may implement the switches 116 and 118, respectively.

A switch 120 is arranged so as to control the connection between the output of the inverter 104 and the storage capacitor $C_{HOLD}$. When a positive value is produced at the output of the inverter 104, the switch 120 is closed to connect the storage capacitor $C_{HOLD}$ with a ground terminal, and when a negative value is supplied from the output of the inverter 104, the switch 120 opens. For example, the switch 120 may be a MOSFET coupled between the storage capacitor $C_{HOLD}$ and a ground terminal, and having a gate connected to the output of the inverter 104.

Finally, a switch 122 may be coupled between the storage capacitor $C_{HOLD}$ and a source of voltage VDD. The switch 122 is controlled by a REFRESH signal provided to recharge the storage capacitor $C_{HOLD}$ in order to reset the peak detector. When the REFRESH signal is at a high level, the switch 122 is closed to allow the storage capacitor $C_{HOLD}$ to be charged to a voltage near VDD. The switch 122 may be implemented by a MOSFET coupled between the voltage source VDD and the storage capacitor $C_{HOLD}$, and having a gate supplied with the REFRESH signal.

The operation of the peak detector 100 is described with reference to timing diagrams in FIG. 4. The storage capacitor $C_{HOLD}$ is initially charged to a voltage value near VDD when the REFRESH signal is supplied. When the PHI1 clock signal goes low and the PHI2 clock signal goes high, the switches 114 and 116 close, and the switch 110 opens. As a result, the voltage remaining on the input capacitor C1 becomes equal to the difference between Vout and (Vout+Vosc), where Vosc is the offset voltage of the comparator 102. The rate of the clock signals PHI1 and PHI2 should be high enough to satisfy the Nyquist criterion for the input signal.

The value Vout developed at the output of the buffer 108 is equal to:

$$Vout = V_{HOLD} + V_{LS} + Voc,$$

where
$V_{HOLD}$ is the voltage across the storage capacitor $C_{HOLD}$,
$V_{LS}$ is the amount by which voltage is changed by the level shifter 106, and
Voc is the offset voltage of the output buffer 108.

When the PHI1 clock signal goes high, the switch 110 opens to allow the analog input signal Vin to pass to the inverting terminal of the comparator 102. The resulting voltage at the inverting terminal equal to (Vin+Vosc) is compared by the comparator 102 with the voltage at the non-inverting terminal equal to (Vout+Vosc). The value produced at the output of the comparator 102 is equal to:

$$Voutc = A(Vout+Vosc-Vin-Vosc) = A (Vout-Vin),$$

where
coefficient A is the open-loop gain of the comparator 102.

Thus, the output of the comparator 102 depends only upon the input and output voltages of the peak detector 100. Accordingly, the offset is cancelled. As the output voltage Vout is produced at the output of the buffer 108, the offset cancellation procedure of the present invention allows to eliminate not only the offset of the comparator 102 but also the offset caused by the output buffer 108.

When the LCK signal goes high during the active period of the PHI1 clock signal, the switch 116 closes and the switch 118 opens to allow the output value of the comparator 102 to drive the inverter 104. As long as the input signal Vin is higher than the output value Vout that represents the previous peak value of the input signal, the comparator 102 produces a positive output value (Comp Out in FIG. 4). As the output value of the inverter 104 is negative, the switch 120 remains open preventing the storage capacitor $C_{HOLD}$ from being discharged.

When the input signal Vin becomes lower than the output signal Vout, the output value of the comparator 102 becomes negative producing a positive value at the output of the inverter 104. As a result, the switch 120 closes allowing the storage capacitor $C_{HOLD}$ to discharge, in order to update the $V_{HOLD}$ value in accordance with the next peak value of the input signal. The delay in supplying the output of the comparator 102 to the switch 120, caused by switches 116 and 118, allows the output signal of the comparator 102 to stabilize before the switch 120 is opened. This prevents the loss of output signal integrity.

Then, the PHI1 clock signal goes low and the PHI2 clock signal goes high to continue the peak value detection process until the value Vout corresponds to the largest negative peak value of the analog input signal Vin detected before the REFRESH signal is supplied. When the REFRESH signal is provided, the switch 122 is closed to charge the storage capacitor $C_{HOLD}$ from the voltage source VDD, providing a reset. When the REFRESH signal goes low, the switch 122 opens to allow the voltage on the storage capacitor to change in accordance with the input signal of the peak detector 100, in order to detect the peak value of this signal.

There, accordingly, has been described a peak detector having a comparator and a storage capacitor coupled to the output of the comparator. An analog input signal is provided via an input capacitor to the inverting input of the comparator. The non-inverting input of the comparator receives an output signal produced by an output buffer arranged in a feedback loop of the comparator. A level shifter is coupled in the feedback loop to dynamically adjust an input signal to the output buffer in accordance with application requirements. The operation of the peak detector is controlled by non-overlapping clock signals supplied to switches at the input and inner feedback loop of the comparator.

Thus, the offset-compensated peak detector of the present invention provides buffering of the output signal to prevent the discharge of the storage capacitor, and performs cancellation of the offset caused by the output buffer, in addition to cancellation of the offset of the comparator.

In this disclosure, there are shown and described only the preferred embodiments of the invention, but it is to be understood that the invention is capable of changes and modifications within the scope of the inventive concept as expressed therein.

What is claimed is:

1. A system for detecting a peak value of an input signal comprising:
   an input terminal for receiving said input signal,
   an input capacitor coupled to said input terminal,
   a comparator having a first input responsive to said input capacitor,
   a storage capacitor coupled to an output of said comparator, for producing voltage, and
   an output buffer arranged in a feedback loop between said storage capacitor and a second input of said comparator, for buffering said voltage to produce an output signal representing the peak value of said input signal, said input capacitor being arranged between the output of said output buffer and the first input of said comparator for providing compensation of offset introduced by components of the system.

2. The system of claim 1 further comprising a first switch coupled between said input and said input capacitor and controlled by a first clock signal.

3. The system of claim 2 further comprising a second switch coupled between the output of said output buffer and the first input of said comparator and controlled by a second clock signal.

4. The system of claim 3, wherein said first and second clock signals are complementary, non-overlapping signals.

5. The system of claim 4 further comprising a third switch coupled between the output of said comparator and the first input of said comparator and controlled by said second clock signal.

6. The system of claim 5, wherein said second switch is closed to connect said output buffer to said input capacitor when said second clock signal is in an active state.

7. The system of claim 6, wherein said third switch is closed to connect the output and the first input of said comparator when said second clock signal is in the active state.

8. The system of claim 7, wherein said first switch is open to disconnect said input terminal from said input capacitor when said second clock signal is in the active state.

9. The system of claim 8, wherein said first switch is closed to supply said input signal via said input capacitor to the first input of said comparator when said first clock signal is in the active state.

10. The system of claim 9, wherein said second and third switches are open when said input signal is supplied to the first input of said comparator.

11. The system of claim 5 further comprising an inverter coupled between the output of said comparator and said storage capacitor for changing the polarity of an output signal of said comparator.

12. The system of claim 11 further comprising a fourth switch coupled between the output of said comparator and said inverter and controlled by a first control signal activated when said first clock signal is in the active state.

13. The system of claim 12 further comprising a fifth switch coupled between the input of said inverter and a ground terminal and controlled by a second control signal inverted with respect to said first control signal.

14. The system of claim 13, wherein said fourth switch is closed and said fifth switch is open to allow the comparator output signal to pass to said inverter when said first control signal is activated.

15. The system of claim 14 further comprising a sixth switch coupled between said storage capacitor and a ground terminal and controlled by an output signal of said inverter.

16. The system of claim 15, wherein said sixth switch is open to prevent said storage capacitor from being discharged when said input signal is higher than said output signal.

17. The system of claim 16, wherein said sixth switch is closed to allow said storage capacitor to discharge when said input signal is lower than said output signal.

18. The system of claim 17 further comprising a seventh switch coupled between said storage capacitor and a voltage source and controlled by a refresh signal activated to charge said storage capacitor from said voltage source.

19. The system of claim 1 further comprising a level shifter arranged in said feedback loop between said storage capacitor and said output buffer for dynamically adjusting an input level of said output buffer.

20. In a system for detecting a peak value of an input signal and having a comparator, a storage capacitor coupled to an output of said comparator, and an output buffer coupled in a first feedback loop between said storage capacitor and a first input of said comparator, for buffering storage capacitor voltage to produce an output signal representing said peak value, a method of offset cancellation comprising the steps of:

activating a first control signal to form a second feedback loop by connecting an output of the output buffer via an input capacitor to a second input of said comparator, activating a second control signal non-overlapping with said first control signal to disconnect said buffer from said second input and to allow said input signal to be supplied via said input capacitor to said second input of said comparator, and controlling said storage capacitor by the output of said comparator to allow a charge on said storage capacitor to be changed in accordance with a value produced at the output of said comparator.

\* \* \* \* \*